[19] US009459283B2

United States Patent
Tomioka

(10) Patent No.: US 9,459,283 B2
(45) Date of Patent: Oct. 4, 2016

(54) CONTACT TEST DEVICE

(75) Inventor: Hiroyuki Tomioka, Ota-ku (JP)

(73) Assignee: SEIKEN CO., LTD., Tokyo (JP)

( * ) Notice: Subject to any disclaimer, the term of this patent is extended or adjusted under 35 U.S.C. 154(b) by 189 days.

(21) Appl. No.: 13/990,186

(22) PCT Filed: Nov. 16, 2011

(86) PCT No.: PCT/JP2011/076443
§ 371 (c)(1),
(2), (4) Date: May 29, 2013

(87) PCT Pub. No.: WO2012/073701
PCT Pub. Date: Jun. 7, 2012

(65) Prior Publication Data
US 2013/0257467 A1     Oct. 3, 2013

(30) Foreign Application Priority Data

Nov. 29, 2010   (JP) .................................. 2010-265603

(51) Int. Cl.
| G01R 1/067 | (2006.01) |
| G01R 1/04 | (2006.01) |
| H01R 13/24 | (2006.01) |

(52) U.S. Cl.
CPC ......... G01R 1/06711 (2013.01); G01R 1/0466 (2013.01); G01R 1/06722 (2013.01); G01R 1/06738 (2013.01); H01R 13/24 (2013.01); H01R 2201/20 (2013.01)

(58) Field of Classification Search
USPC ............ 324/755.05, 755.01, 754.03, 756.03, 324/754.11, 756.02, 756.07, 750.25, 324/755.11, 537, 754.01, 754.05, 754.1, 324/754.12; 439/700, 816, 824; 29/874
See application file for complete search history.

(56) References Cited

U.S. PATENT DOCUMENTS

| 6,768,327 | B2* | 7/2004 | Felici et al. .............. 324/755.06 |
| 2006/0267601 | A1* | 11/2006 | Farris et al. .................... 324/753 |
| 2007/0145991 | A1* | 6/2007 | Yoshida ................. G01R 1/045 324/755.01 |
| 2008/0042676 | A1* | 2/2008 | Yamada et al. ................ 324/757 |
| 2012/0074979 | A1* | 3/2012 | Lee ..................... G01R 1/06716 324/755.01 |

FOREIGN PATENT DOCUMENTS

| CN | 201583629 | 9/2010 |
| JP | 61-91174 | 6/1986 |
| JP | 2004-325197 | 11/2004 |
| JP | 2006-292456 | 10/2006 |

(Continued)

OTHER PUBLICATIONS

Office Action issued Oct. 29, 2014 in corresponding Chinese patent application No. 201180057125.2.

(Continued)

*Primary Examiner* — Melissa Koval
*Assistant Examiner* — Nasima Monsur
(74) *Attorney, Agent, or Firm* — Wenderoth, Lind & Ponack, L.L.P.

(57) ABSTRACT

A probe is fitted into cylindrical retaining holes formed in an upper block and a lower block. A plunger of the probe has a plate-like guide portion, and an edge contact portion. A bottomed one of the cylindrical retaining holes is formed in the upper block from a lower part thereof and a guide groove is formed from an upper surface thereof. The plate-like guide portion is movably guided vertically while being prevented from turning and slipping out by the guide groove.

20 Claims, 19 Drawing Sheets

(56) References Cited

FOREIGN PATENT DOCUMENTS

| JP | 2008-45986 | 2/2008 |
|---|---|---|
| JP | 2008-045986 | 2/2008 |
| JP | 2008-249460 | 10/2008 |
| JP | 2010-38837 | 2/2010 |
| TW | M317015 | 8/2007 |
| TW | 200739085 | 10/2007 |

OTHER PUBLICATIONS

International Search Report (ISR) mailed Dec. 20, 2011 in International (PCT) Application No. PCT/JP2011/076443.

* cited by examiner

Fig.13A      Fig.13B      Fig.13C
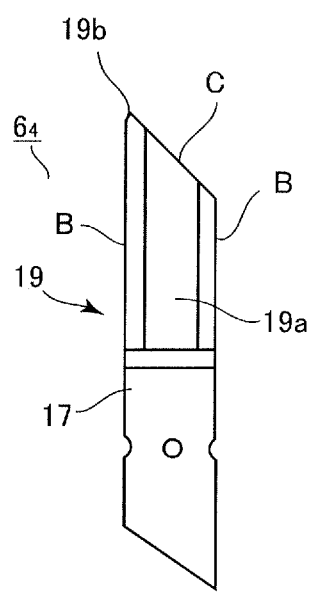 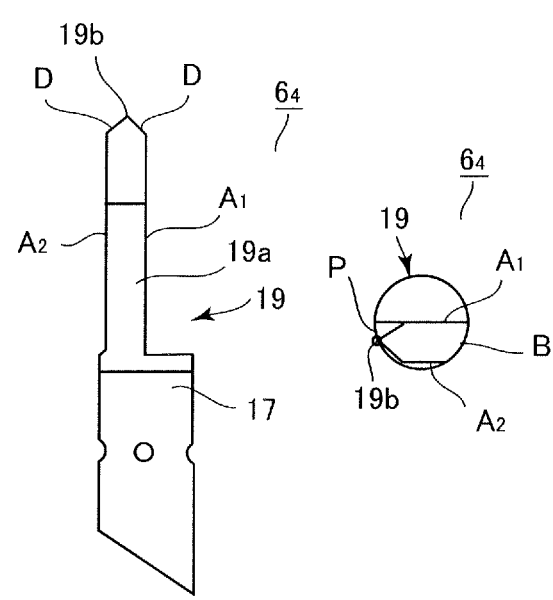

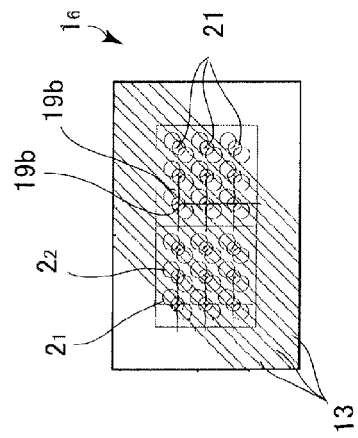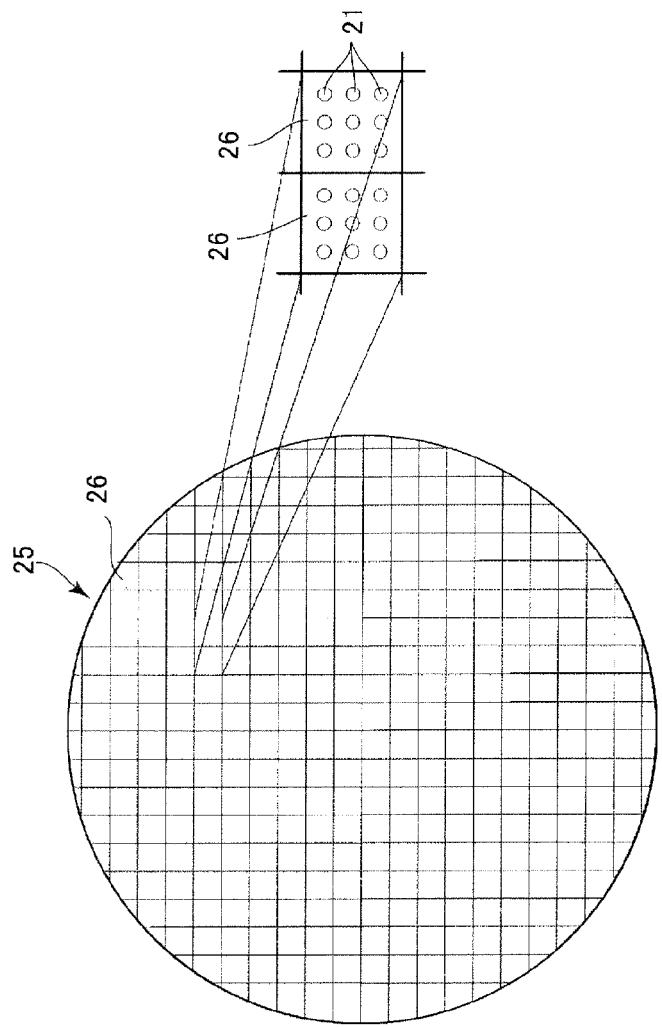

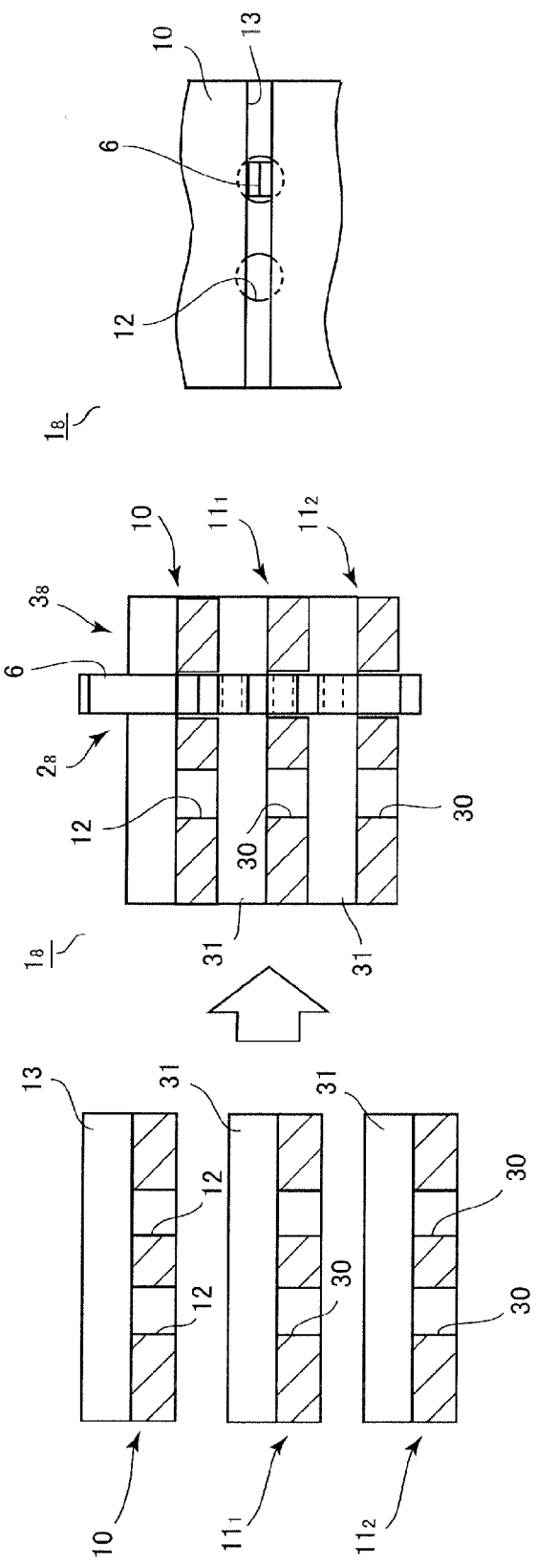

CONTACT TEST DEVICE

BACKGROUND OF INVENTION

Technical Field

The present invention relates to a contact test device for use in functional tests of test electronic parts by contacting with each terminal (electrode pad) or an electrode of the test electronic parts, and more specifically to a contact test device (test head) suitable for Kelvin testing in which two current supplying and voltage monitoring probes are brought into contact with each terminal or electrode described above.

BACKGROUND ART

A pitch between metallic connecting terminals (electrode pad) extended from each side of a rectangular QFP (Quad Flat Package) is being narrowed lately more and more from 0.8 mm to 0.65 mm, 0.5 mm and 0.4 mm. An electrode pitch of a semiconductor product in which electrodes (terminals) called peripherals are disposed around a rectangular silicon wafer is also being narrowed from 100 µm to 65 µm, 50 µm, and 40 µm. Then, a probe that is brought to come into contact with such terminal whose pitch is narrowed is required to thin a diameter thereof. Due to that, it has become cumbersome to manufacture a contact test device such as a test head in which a large number of such probes is arrayed. Still further, due to a drop of contact pressure with each of the terminals (electrode) and an increase of electrical resistance of the probe itself or the like, such a thinned probe causes a drop of voltage during measurement, thus causing a drop of reliability of electrical measurement.

A Kelvin testing method is known as a contact testing method that accommodates to such measurement environment. The Kelvin testing method uses a force contact probe for supplying electric current and a sense contact probe for monitoring voltage as a pair to one terminal (electrode). This makes it possible to accurately test electrical characteristics by making the pair of probes contact with each terminal.

Heretofore, Patent Literature 1 described below has proposed a Kelvin test device configured as follows. A pair of probes is fitted into plunger retaining holes formed in an insulating socket. A plunger edge portion of each of the pair of probes has both side surfaces in parallel with a tube axial direction and an edge line inclined in one direction. Then, one side surface on a projecting edge including a peak of the edge line is formed of a curved surface that conforms to an extension surface of a tube outer peripheral surface. Then, the plunger edge portions of the pair of probes are formed at positions eccentric to a tube center line and are fittingly and slidably inserted into guide holes of the socket (retainer) such that they cannot be inserted reversely by 180 degrees.

CITATION LIST

Patent Literature

Japanese Patent Application No. 2010-38837

Technical Problem

That is, the pair of contact probes described in Patent Literature 1 is configured such that the plunger edge portions thereof are blocked from erroneously inserted, i.e., from reversely positioned, and disposed such that one side surfaces of the projecting edge that come into contact with terminals of the test electronic parts approach with each other, so that it is possible to accommodate to the electronic part whose pitch between the terminals is narrowed.

However, the guide holes formed in the socket (retainer) into which the plunger edge portions are inserted are substantially formed into a rectangular shape corresponding to a rectangular shape of the plunger edge portions. The rectangular holes are required to be perforated by a rotational cutting tool such as an end mill or by laser. A cumbersome machining by means of the rotational cutting tool is required in particular when the hole is composed of the rectangular guide hole for fittingly inserting the edge portion, a flange portion, and a retaining hole whose cross-section is circular for fittingly inserting a tube, like the case as shown in Patent Literature 1.

Therefore, minimizing of the probe is limited by being restricted by the guide hole for fittingly inserting the plunger edge portion, making it difficult to fully accommodate with narrowing of a pitch between terminals and multi-polarization implemented in these days. Still further, because the cumbersome machining is required to form the guide hole for fittingly inserting the plunger edge portion in the socket, it has become a factor of an increase of cost.

It is noted that the guide hole for guiding the plunger at the edge of the probe is formed as a through hole in accordance to a cross-sectional shape of the plunger in general, not only for the Kelvin test device, as described above in Patent Literature 1.

SUMMARY OF INVENTION

Accordingly, the present invention aims at providing a contact test device solving the problems described above by configuring such that a plunger edge portion that comes in contact with test electronic parts is guided such that it is vertically moved while stopped from turning by a guide groove formed on a socket (block).

Solution to Problem

As shown in FIGS. 1 through 3 for example, a contact test device (1) of the invention configured to test electrical characteristics of a-test electronic parts, including a probe (2) that comes in contact with a terminal or an electrode of the test electronic parts, and includes a plunger (6) biased such that it comes in resilient contact with the terminal or the electrode, the plunger (6) including a plate-like guide portion (19a) obtained by removing side surfaces (A, A) of an edge portion of the plunger, and a contact portion (19b) formed into a peak at an edge of the guide portion (19a), and a socket (3) configured to retain the probe (2) and including at least a first block (10) positioned on a side of the terminal or electrode, the first block (10) including a guide groove (13) of a predetermined depth from a surface of the first block (10).

wherein the socket(3) movably guides the guide portion (19a) of the plunger (6) in an axial direction of the plunger while stopping the guide portion (19a) from turning by the guide groove (13).

As shown in FIGS. 1 through 3 for example, the probe (2) includes, a tube (5) integrally secured with a cylindrical portion (17) of the plunger (6), an abutting member (7) axially movably inserted into another end of the tube; and a spring stored in the tube contractively between the plunger (6) and the abutting member (7); and wherein the socket (3) is composed of a plurality of joined blocks (10, 11);

each of the blocks has a retaining hole (12, 15) configured to retain the probe (2);

the retaining hole (12) of the first block (10) among those blocks is formed as a bottomed hole formed from the other block (11) side; and the guide groove (13) is formed such that it crosses the bottom holes (12).

As shown in FIGS. 9 and 10 for example, the probe is a wire probe ($2_3$) retained by the first block ($10_3$) and another block ($11_3$) disposed apart from the first block by a space (F), and is configured to curve within the space (F) such that resilience is applied in the axial direction;

one end portion of the wire probe is formed into the plunger (6) having the guide portion (19a) and the contact portion (19b); and a bottomed hole (12) configured to retain the retaining portion (17) of the wire probe ($2_3$), and the guide grooves (13) crossing the bottomed hole are formed in the first block ($10_3$).

As shown in FIGS. 18 and 19 for example, the probe ($2_8$) is shaped by electroforming into a rectangular shape in section, and the plunger (6) having the guide portion (19a) and the contact portion (19b) is formed at one end of the probe ($2_8$), and the socket ($3_8$) is constructed by laminating a plurality of blocks (10, $11_1$, $11_2$) in each of which a groove (31) is formed on one surface and a hole (30) communicating with the groove is formed on another surface, the groove (31) and the hole (30) retain the probe ($2_8$), and the groove formed in the first block (10) among those blocks is made to be the guide groove (13) having a narrow width and guides the guide portion (19a) of the plunger (6) movably in the axial direction while stopping the plunger (6) from slipping out.

As shown in FIGS. 4 through 6, the guide grooves (13a, 13B) are formed in horizontal and vertical directions on a surface of the first block (10), the probes (2) are arrayed at both end parts where these guide grooves do not cross; and the probes (2) are disposed alternately in zigzag in a direction along the guide groove corresponding to the terminals or electrodes (21).

As shown in FIGS. 7 and 8 for example, a pair of the probes ($2_1$, $2_2$) is brought in contact with one electrode (21) or terminal for a Kelvin testing, each of the contact portions (19b) of the plungers is formed by one end peak portion of an edge of the plate-like guide portion (19a) inclining in a width direction; and the pair of probes ($2_1$, $2_2$) for Kelvin test is disposed such that the contact portions (19b) come in close proximity with each other.

As shown in FIGS. 7, 8, and 14 for example, the pair of probes ($2_1$, $2_2$) for Kevin test is disposed such that the guide portions (19a) of the plungers thereof are guided by the same guide groove (13, $13_4$).

As shown in FIGS. 3 and 10 for example, the guide portion (19a) is formed by right and left planes (A, A) obtained by removing both sides of the cylindrical retaining portion (17) of the plungers (6, 6) by same amounts and front and rear arc surfaces (B, B) extending from the retaining portion, and is disposed at a center part of the retaining portion (17).

As shown in FIGS. 13 and 17 for example, the guide portion (19a) is formed by right and left planes ($A_1$, $A_2$) obtained by removing both sides of the cylindrical retaining portion (17) of the plungers ($6_4$, $6_7$) by different amounts and front and rear arc surfaces (B, B) and ($B_1$, $B_2$) extending from the retaining portion, and is disposed in offset from a center of the retaining portion (17).

As shown in FIGS. 16 and 17 for example, each guide portion (19a) is formed by inner and outer planes ($A_1$) and ($A_2$) obtained by removing both sides of the cylindrical retaining portion (17) of each plunger ($6_7$) by different amounts and front and rear arc surfaces ($B_1$, $B_2$) extending from the retaining portion (17), and is disposed in offset from a center of the retaining portion (17), the contact portion (19b) is composed of an apex (P) which is a cross point of the outer plane ($A_2$) and one of the front and rear arc surfaces ($B_1$), the apex being formed by inclined surfaces (C, S, T) inclined in width and thickness directions with an edge line (G) connecting the apex and a cross point (Q) of the inner plane ($A_1$) and another one ($B_2$) of the front and rear arc surfaces, and the pair of probes ($2_1$, $2_2$) for Kelvin test is disposed such that the adjacent guide grooves ($13_7$) guide the guide portions (19a).

It is noted that while the reference numerals within parentheses are provide to collate drawings, they do not affect configurations described in Claim by any means.

Advantageous Effects of Invention

According to the first aspect of the invention, the plate-like guide portion formed on the plunger is guided by a guide groove formed in the first block, so that guide groove can be machined relatively readily and in high precision by a dicing saw or the like. This makes it possible to break through the difficulty in machining the plunger guide hole which has hampered in minimizing an array distance of the probes and in arraying a large number of arrays. Accordingly, it is possible to provide the contact test device (testing head) accommodating to narrowing of pitch of terminals or electrodes of test electronic parts and to multi-polarization without increasing the cost.

Still further, the guide groove can be formed in high precision readily by the dicing saw even if ceramics is used for the blocks composing the socket, so that it is possible to manufacture the high precision contact test device.

According to the second aspect of the invention, it is possible to narrow the pitch, to multi-polarize and to cut the cost by applying the invention to the contact test device using the contact probe in which the plunger, the abut member and the spring are built in the tube.

According to the third aspect of the invention, it is still possible to narrow the pitch, to multi-polarize and to cut the cost by applying the invention to the vertical probe card or the like using the wire probe.

According to the fourth aspect of the invention, it is further possible to narrow the pitch, to multi-polarize and to cut the cost by applying the invention to the contact test device (testing head) using the probe made by electroforming.

According to the fifth aspect of the invention, it is possible to manufacture the test device accommodating to narrow pitch terminals readily at low cost by applying the invention to the contact test device that tests QFP and by arraying the probes in zigzag.

According to the sixth aspect of the invention, it becomes possible to dispose the pair of probes with the narrow distance and to dispose the contact portions in close proximity, so that it is possible to carry out functional tests of electronic parts of semiconductor device in high precision by applying as the Kelvin test device.

According to the seventh aspect of the invention, it is possible to apply the Kelvin measuring pair of probes to various electrodes or terminals by disposing such that they are guided by the same guide grooves.

According to the eighth aspect of the invention, it is easy to fabricate the probe because the guide portion of the plunger is disposed at the center of the cylindrical portion.

According to the ninth aspect of the invention, because the guide portion of the plunger is disposed in offset with respect to the cylindrical portion, it is possible to prevent erroneous insertion of the plunger into the retaining hole and the guide hole and to dispose the contact portions of the pair of probes such that they are always in close proximity to come into contact with one electrode or the like when used as the Kelvin measuring device.

According to the tenth aspect of the invention, it is possible to provide the contact portion at the cross point (apex) between one arc surface and the outer plane, to dispose the pair of Kelvin test probes in the adjacent guide grooves, so that it is possible to dispose the contact portions of the probes in close proximity, to carry out Kelvin measurement to the electrodes or terminals whose pitch is narrowed and multi-polarized, and to measure a plurality of DUTs simultaneous.

BRIEF DESCRIPTION OF DRAWINGS

FIG. 13A is a front view showing a plunger edge portion;

FIG. 13B is a side view thereof;

FIG. 13C is a plan view thereof;

FIG. 15A is a plan view of a device (DUT) of a silicon wafer measurable by the invention;

FIG. 15B is a partially enlarged view thereof;

FIG. 15C is a plan view showing a contact test device applied to that;

FIG. 18A illustrates another embodiment of the invention and shows respective blocks of a socket to be laminated;

FIG. 18B is a front section view showing the contact test device;

FIG. 18C is a plan view thereof;

DESCRIPTION OF EMBODIMENTS

Figure 1A:
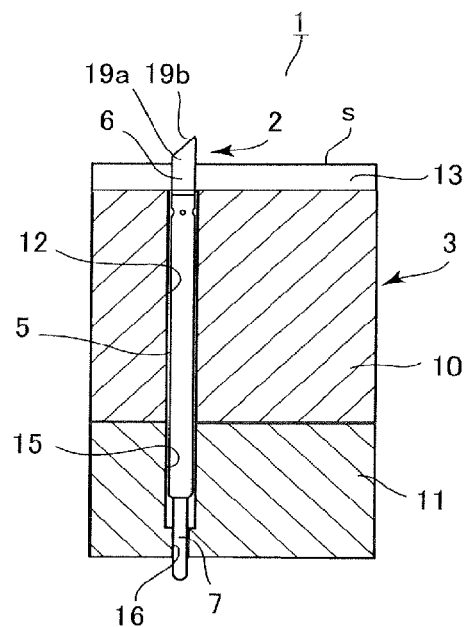
FIG. 1A is a front cross-sectional view taken along the 1A-1A line in FIG. 1B showing a contact test device of the invention.
Figure 1B:
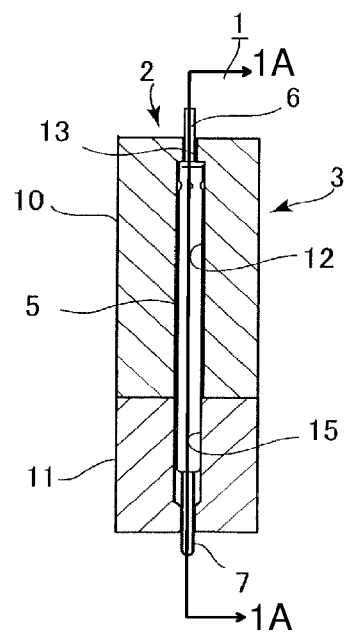
FIG. 1B is a side section view thereof.
Figure 1C:
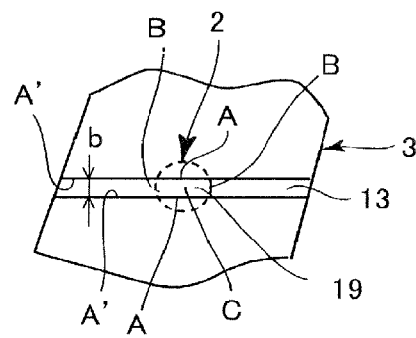
FIG. 1C is a plan view thereof.

An embodiment of the present invention will be described below with reference to the drawings. As shown in FIG. 1, a contact test device 1 of the present embodiment includes a contact probe 2 made from conductive metal, and a socket 3 made from an insulating material into which the probe 2 is fitted. The probe 2 includes a tube 5, a plunger 6 which projects out of one end of the tube 5 and which is secured in a body to the tube 5, and a abutting member 7 which projects movably out of another end of the tube 5 due to a spring contractively interposed between the abutting member 7 and the plunger 6.

Figure 2:
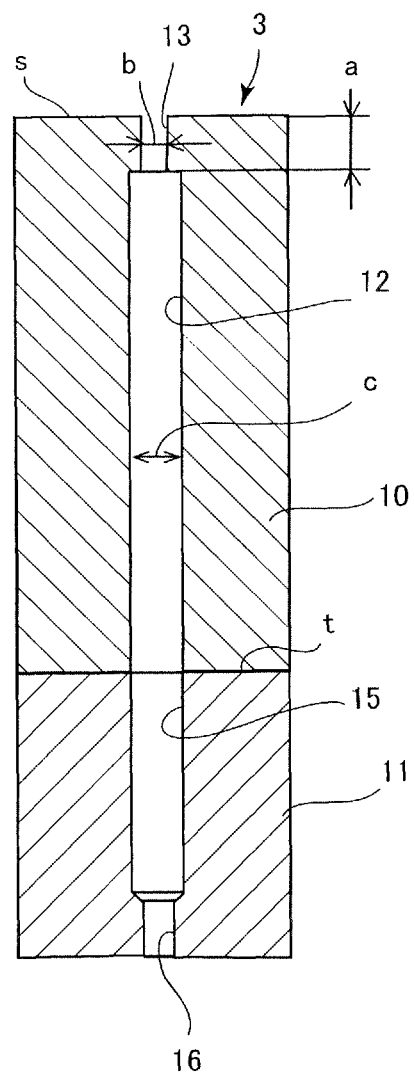
FIG. 2 is a side section view showing a socket of the contact test device.

The socket 3 is composed of blocks 10 and 11 by being divided into two parts as shown in detail in FIG. 2 (the number of blocks is not limited to be two, and may be three or more or one). These blocks are provided with cylindrical retaining holes for retaining the probe such that they are aligned. Although these blocks 10 and 11 are not limited to be used as upper and lower blocks, they will be called as the upper block 10 and the lower block 11 for convenience in accordance to the drawings. The upper (first) block 10 is provided with a first retaining hole 12 which is perforated into a cylindrical bottomed shape by leaving a predetermined distance (a) from a lower part to an upper part and through which the tube 5 is vertically slidably fitted. A guide groove 13 having a predetermined depth (a) from an upper surface (s) of the upper block 10 is formed by a dicing blade (grinding stone). The guide groove 13 is in communication with the first retaining hole 12 such that it crosses a center part of an edge (bottom) of the first retaining holes 12. That is, the first retaining hole 12 penetrates to the upper surface (s) through the guide groove 13 that crosses the center part with a width (b) which is smaller than a diameter (c) of the first retaining hole 12 at an upper end part thereof. The lower (other) block 11 includes a second retaining hole 15 having the same diameter with the first retaining hole 12 with a predetermined depth from an upper surface (t), and a third (cylindrical) hole 16 formed such that the hole 16, having a diameter smaller than that of the second retaining hole 15, penetrates through a lower surface from a bottom surface of the second retaining hole 15.

The upper block 10 and the lower block 11 are fixed in a body such that the tube 5 of the probe 2 is inserted across the first and second holes 12 and 15, the plunger 6 penetrates through the guide groove 13, and the abutting member 7 penetrates through the third hole 16. Accordingly, the probe 2 is fitted into the socket 3 composed of the upper and lower blocks 10 and 11 by being biased such that the plunger 6 projects upward and the abutting member 7 projects downward.

Figure 3A:
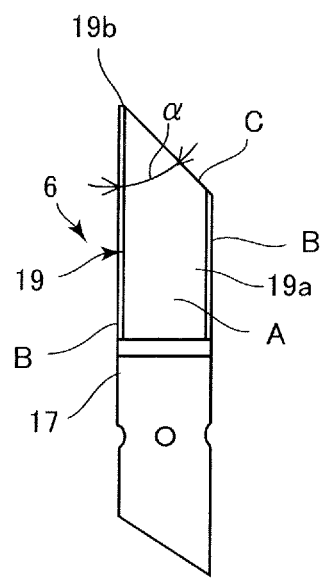
FIG. 3A is a front view showing a plunger.
Figure 3B:
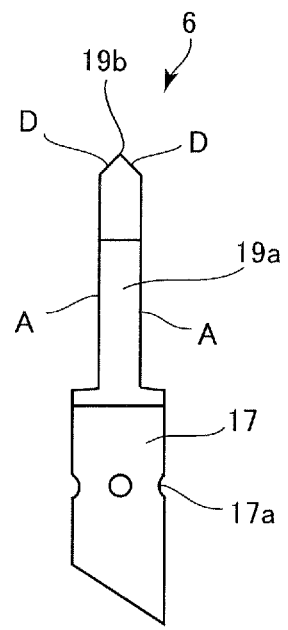
FIG. 3B is a side view thereof.

As shown in FIG. 3, the plunger 6 includes a cylindrical retaining portion (cylindrical portion) 17 that fits with the tube 5, and an edge portion 19 guided by the guide groove 13. The cylindrical portion 17 has a concave portion 17A, and the cylindrical portion 17 may be secured integrally to the tube 5 by caulking the tube 5 toward the concave portion 17A. The edge portion 19 projects upward out of the tube 5, and has planes A in parallel with each other formed by cutting both side surfaces of the cylindrical portion 17. Still further, the edge of the edge portion 19 includes an inclined surface C inclined in one direction with a predetermined angle α. The inclined surface C is chamfered from both planes toward an edge line at the center in a thickness direction as planes D. Accordingly, the edge portion 19 includes the thin plate-like guide portion 19a formed by the both planes A and arc planes B extending from the cylindrical portion 17, and the contact portion 19b formed by a peaked edge of the guide portion which is composed of the inclined surface C and the chamfered planes D. The planes A of the guide portion 19a are in contact with both wall surfaces A' of the guide groove 13, so that the guide portion 19a is guided movably in the vertical direction while being stopped from turning by the guide groove 13. Still further, the contact portion 19b can be in contact with the terminal or electrode of the test electronic parts.

Accordingly, the guide portion 19a of the plunger 6 of the probe 2 is stopped from turning and is vertically movably guided by the guide groove 13 and the peaked contact portion 19b is in resilient contact with the terminal or electrode of the test electronic parts with a predetermined attitude. It is also possible to form the guide portion 19a of a predetermined width and the contact portion 19b of the plunger 6 of the probe 2 readily and in high precision by cutting side surfaces of a cylindrical pin into the shape of the planes A and by the inclined surface C and the chamfered surface D. Meanwhile, the bottomed cylindrical hole 12 having a predetermined diameter is formed in the upper block 10 composing the socket 3 from the lower surface thereof, and the guide groove 13 having the predetermined depth (a) is formed by a dicing blade (grinding stone) or the like from the upper surface (s). This makes it possible to machine the retaining hole for retaining the probe 2 in the socket 3 and the guide groove 13 that stops the guide portion 19a from turning in particular in high precision, readily and with high productivity.

It is noted that because the guide groove 13 can be formed by a dicing saw or a metal saw, it is possible to use ceramics that is liable to be machined with high dimensional accuracy for the upper block 10. It also makes it possible to finish the guide portion 19a accurately by grinding or the like and to retain the probe 2 at position and to non-turnably guide the probe 2 in high precision. While it is preferable to form the guide groove 13 by machining by the dicing saw or the like, it is possible to form an uppermost block as a relatively thin plate-like retainer and to form a long hole-like groove in which both ends thereof are left in the retainer by laser machining. In this case, the retainer is fixed to the block having the retaining hole through which the probe 2 penetrates in high positional precision.

This makes it possible to form the retaining holes for retaining the probe 2 and the turn-stopping guide groove 13 of the contact test device 1 such as a testing head to be small and with small pitch on the socket (block) 10. This also makes it possible to array the probes 2 with narrow pitch and with a large number of rows, to improve reliability of electrical tests, and to cut the cost.

Figure 4:
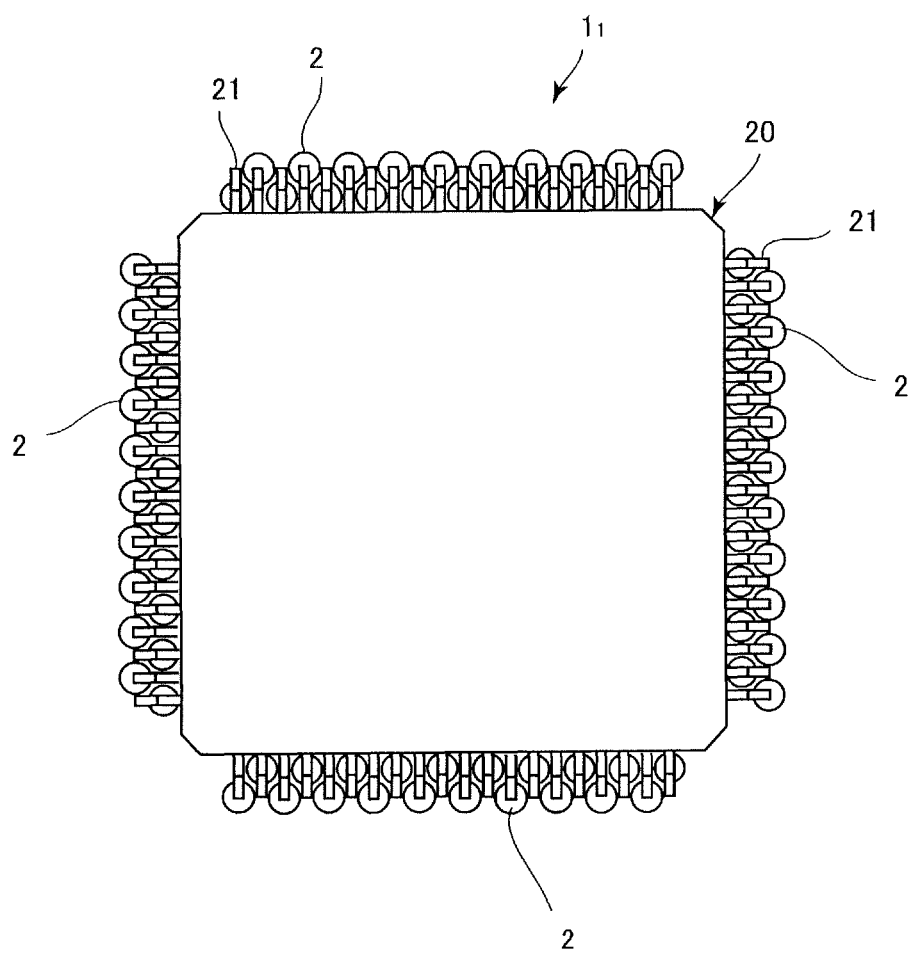
FIG. 4 is a plan view showing a case when the contact test device of the invention is applied to a QFD (Quad Flat package)
Figure 5:
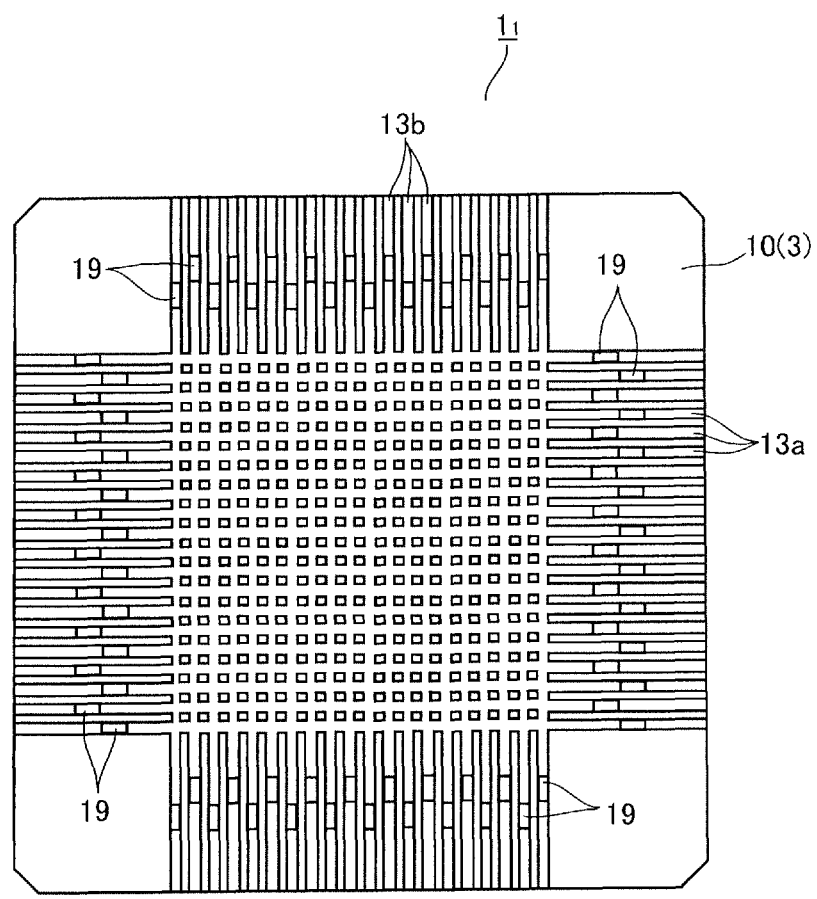
FIG. 5 is a plan view of that contact test device.

A large number of probes 2 are fitted into the socket 3 with a predetermined array. As shown in FIG. 4, metallic connection terminals 21 extend in four directions from a rectangular body of a QFP (Quad Flat Package) 20, and each probe 2 of the contact test device $1_1$ comes in contact with each of those terminals. As shown in FIG. 5, the contact test device (test head) $1_1$ is provided with a large number of guide grooves 13 in grid on the upper surface of the upper block 10. While horizontal grooves 13A cross with vertical grooves 13B, the probes 2 are disposed on both end parts of the horizontal and vertical grooves 13A and 13B where they do not cross with each other. The respective probes 2 are arrayed alternately in zigzag with respect to directions of the respective guide grooves 13A and 13B. The edge portions 19 project by being guided upward in the both ends parts of the respective guide grooves, so that the both end parts of the respective guide grooves and the respective probes 2 correspond to the respective connection terminals 21.

Figure 6A:
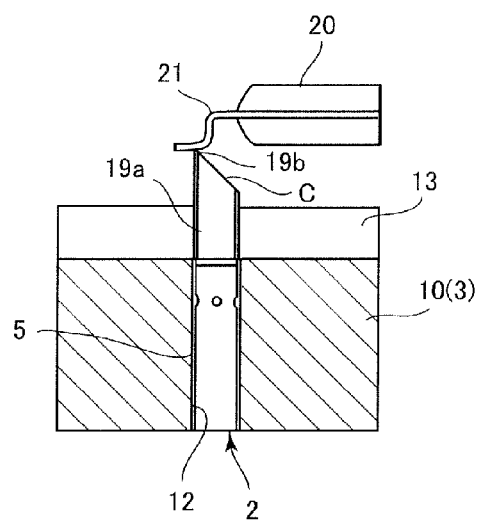
FIG. 6A is a front section view at one location.
Figure 6B:
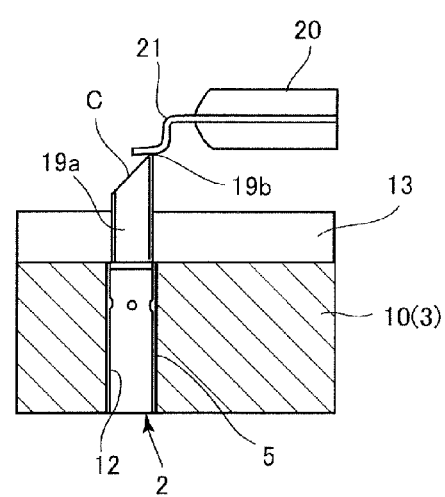
FIG. 6B is a front section view at a different location from that in FIG. 6A.

As shown in FIGS. 6A and 6B, the respective probes 2 are fitted alternately into the retaining holes 12 (15) of the socket 3 such that the inclined surfaces C of the edge portions 19 of the neighboring probe 2 face in opposite directions. The contact portions 19b of the respective probes come into contact with the respective terminals 21 substantially at equal position in a longitudinal direction of each terminal, and the holes 12 (15) through which the tubes 5, whose diameter becomes largest diameter of each probe 2, are inserted are arrayed by being away in a front and back direction (the terminal longitudinal direction) with respect to the respective neighboring terminals 20, so that it is possible to accommodate to narrowing of the pitch.

Figure 7A:
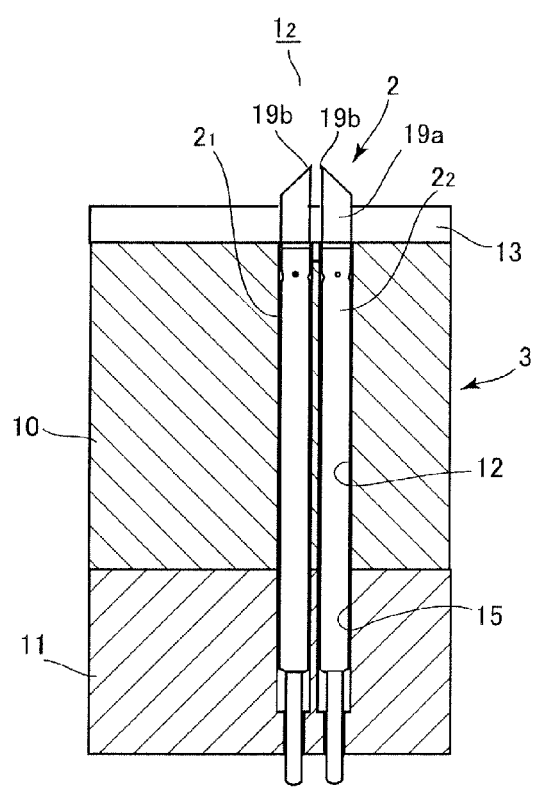
FIG. 7A is a front section view showing an embodiment in which the device of the invention is applied to a Kelvin test.
Figure 7B:
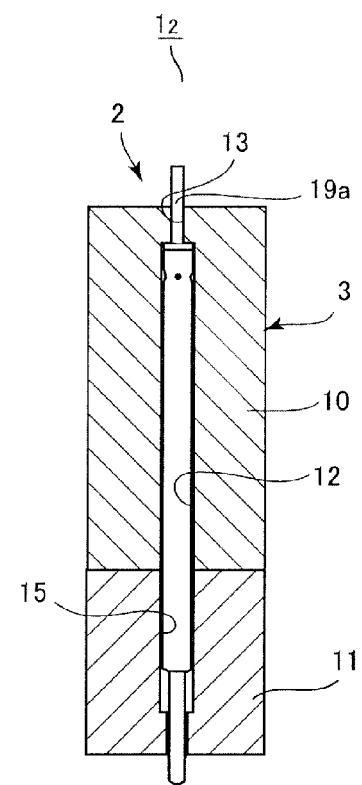
FIG. 7B is a side section view thereof.
Figure 8A:
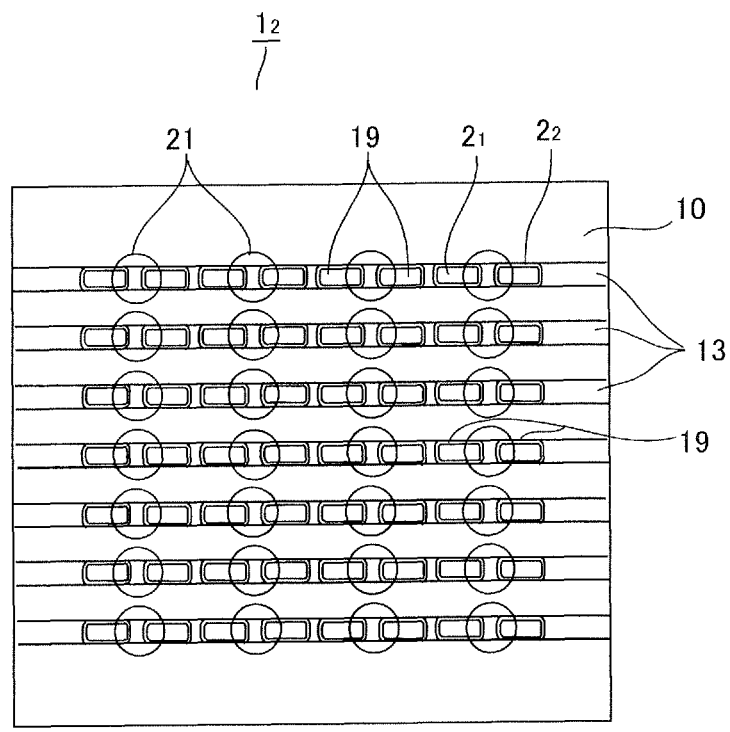
FIG. 8A is a plan view thereof.
Figure 8B:
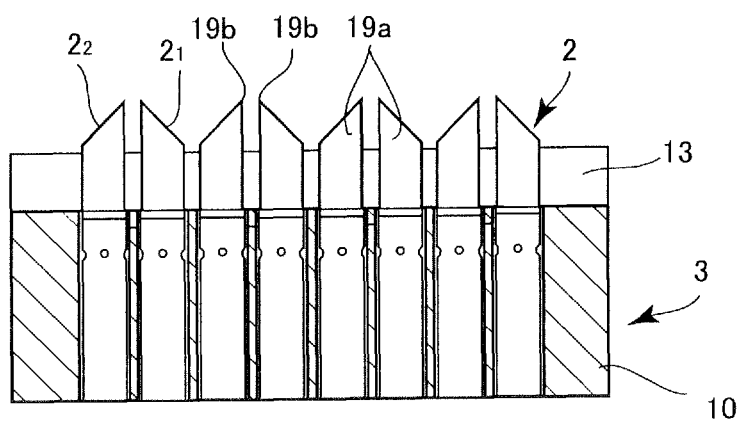
FIG. 8B is a front section view thereof.

FIGS. 7 and 8 show an embodiment in which the contact test device described above is used for Kelvin test. In the contact test device (test head) $1_2$, sets of two probes 2 are arrayed along the guide groove 13 formed on the upper block 10. The probes $2_1$ and $2_2$ of the pair are fitted into the holes 12 and 15 of the socket 3 in a condition reversed by 180 degrees from each other such that the edge portions 19 face with each other. The respective probes $2_1$ and $2_2$ are retained such that the edge guide portions 19a are stopped from turning by the guide grooves 13 (more accurately, the planes A of the guide portions come in slidable contact with the wall surfaces A' of the grooves 13) and such that the contact portions 19b are retained by being biased so that they come in pressure contact with the electrodes (or terminals) 21. The pair of probes $2_1$ and $2_2$ is disposed such that their contact portions 19b come in proximity to come in contact with one electrode 21. One of the pair of probes $2_1$ and $2_2$ is used as current supplying probe (force contact) and the other one is used as a voltage monitoring probe (sense contact). A large number of pairs of probes $2_1$ and $2_2$ are arrayed corresponding to the respective electrodes 21 along the same groove of the respective guide grooves 13 arrayed in parallel.

This arrangement makes it possible to carry out highly accurate testing by the Kelvin testing method by applying the pair of probe contact portions 19b to each bump even if a chip whose inter-electrode pitch is 0.2 mm or less and has a large number of, e.g. several thousands, electrodes such as an IC bear chip mounted to a mounting board of a flip-flop BGA (Ball Grid Array) for example. It is noted that although the same types of the pair of probes $2_1$ and $2_2$ are used in the embodiment, it is also possible to use a voltage monitoring probe having a diameter smaller than that of a current supplying probe and to narrow a distance between a pair of probes further to accommodate to multi-polarization.

Figure 9:
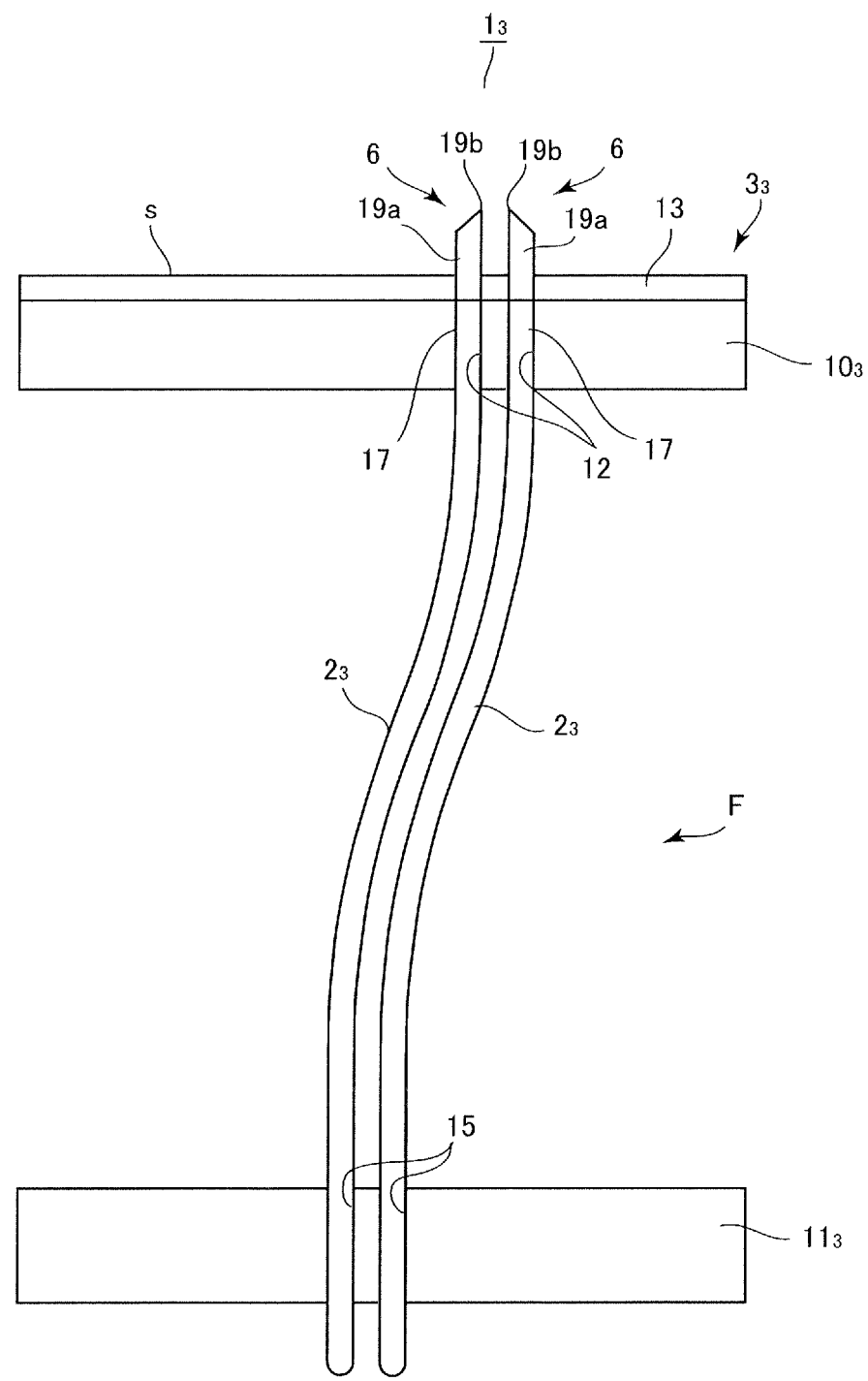
FIG. 9 is a front section view showing an embodiment in which the contact test device of the invention is applied to a vertical probe card.
Figures 10A, 10B:
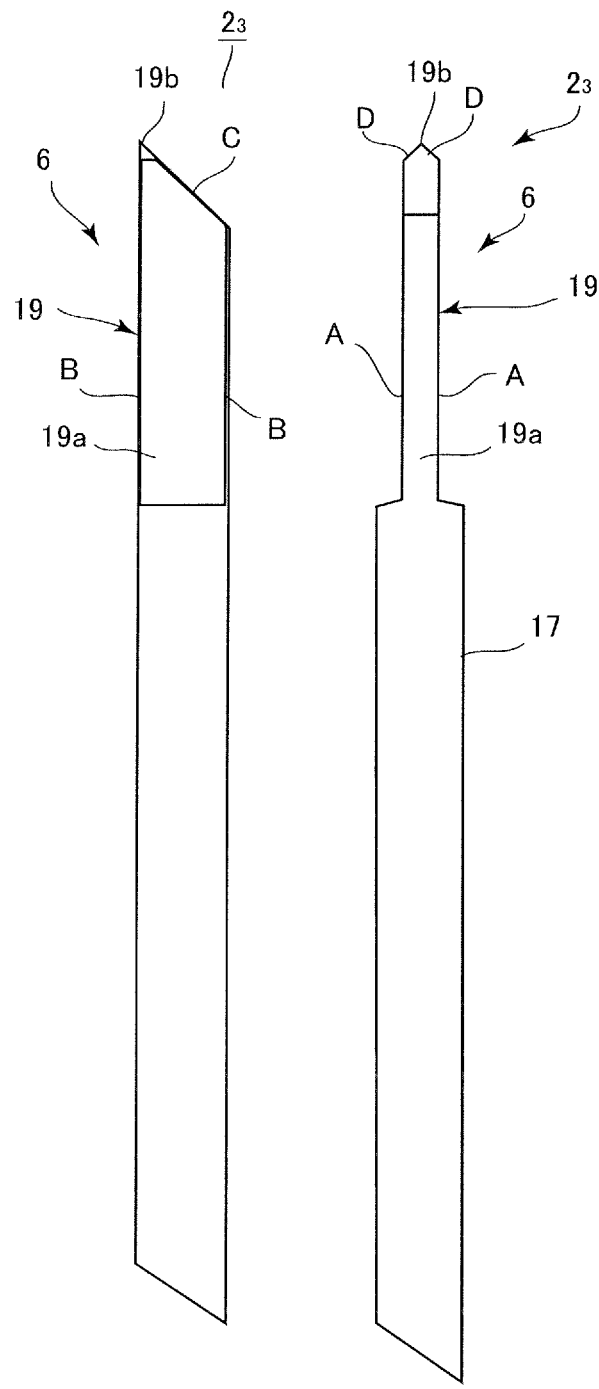
FIG. 10A is a front view showing a wire probe edge portion thereof.
FIG. 10B is a side view thereof.

FIGS. 9 and 10 show an embodiment in which the invention is applied to a vertical probe card. A contact test device (testing head) $1_3$ of the present embodiment includes a metallic wire probe $2_3$ having resilience (buckling stress) and a socket $3_3$ having an upper block $10_3$ and a lower block $11_3$ integrally combined while keeping a space F between them. The wire probe $2_3$ is inserted into first and second cylindrical retaining holes 12 and 15 offset more or less in the upper block $10_3$ and the lower block $11_3$ in a condition resiliently curved. The guide groove 13 is formed on the upper block $10_3$ from the upper surface (s) such that the groove crosses a center part of the first retaining hole 12 in communication with an edge bottom portion of the first retaining hole 12. An edge portion of the wire probe $2_3$ is formed as a plunger 6 similarly to one as described above in the previous embodiment. The plunger 6 includes a plate-like guide portion 19a having planes A as both side surfaces and arc surfaces B as front and back surfaces having a same diameter with the cylindrical (retaining) portion 17, and a contact portion 19b including an inclined surface C and a chamfered surfaces D. The cylindrical (retaining) portion 17 of the plunger 6 is retained by the retaining hole 12 of the upper block $10_3$ such that it is guided movably in the vertical direction and the guide portion 19a is stopped from turning and from slipping out by the guide groove 13 in the wire probe $2_3$. A set of two such wire probes $2_3$ is arrayed for a Kelvin test that comes in contact with one terminal (or electrode), and the pair of contact portions 19b is disposed in close proximity so as to face with each other.

The contact test device $1_3$ is configured such that when the contact portion 19b of the wire probe $2_3$ comes in contact with the terminal (or electrode) of the test electronic parts, the pair of wire probes $6_3$ defect in parallel so that they do not contact with each other in the space F of the socket $3_3$ and to bring the contact portion 19b in resilient contact with the terminal by its reaction force. It is noted that the contact test device $1_3$ including the wire probe $2_3$ is not limited to be one for Kelvin testing, it is of course applicable to one in which one contact portion 19b comes in contact with one terminal (electrode).

Figure 11A:
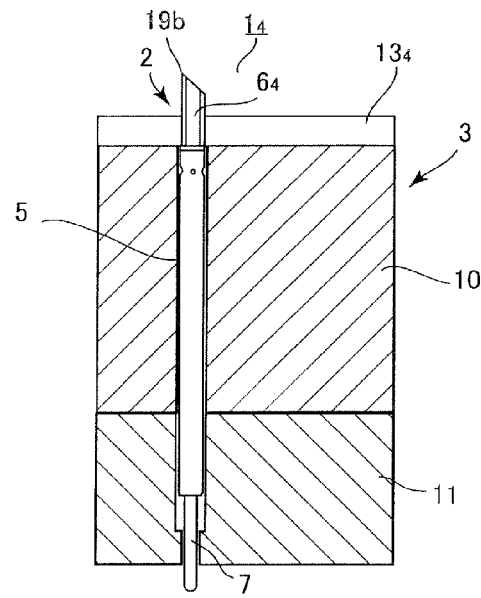
FIG. 11A is a front section view showing an embodiment in which the plunger edge portion is disposed in offset.
Figure 11B:
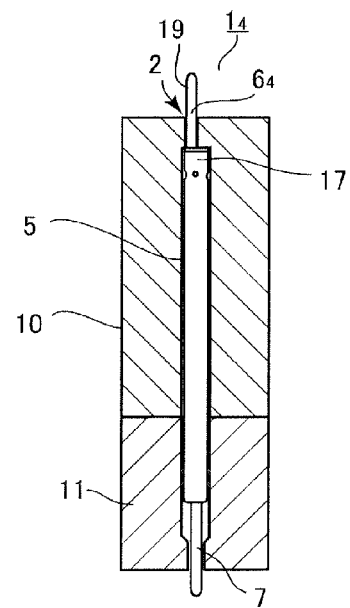
FIG. 11B is a side section thereof.
Figure 11C:
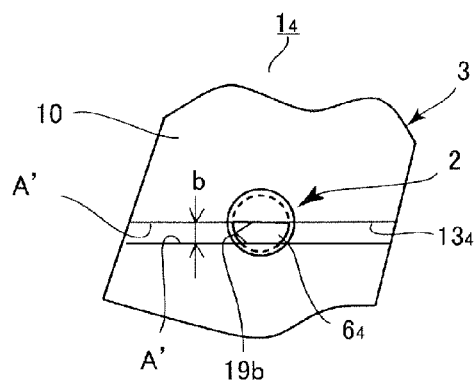
FIG. 11C is a plan view thereof.
Figure 12:
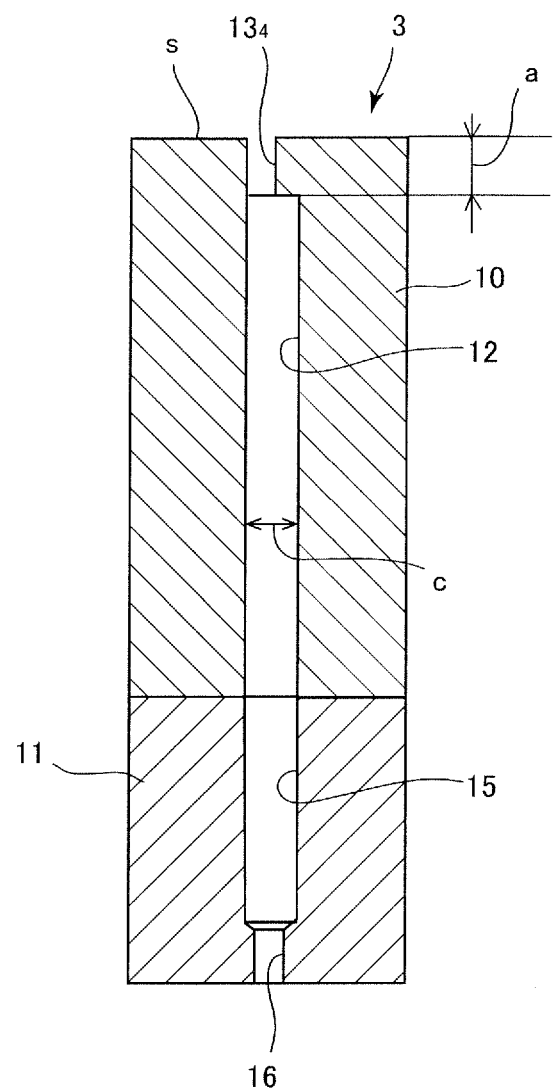
FIG. 12 is a front section view showing a socket thereof.

FIGS. 11 through 13 illustrate an embodiment using a probe having a plunger disposed in offset with respect to a cylindrical (retaining) portion. It is noted that the same or corresponding parts with those shown in FIGS. 1 through 3 will be denoted by the same reference numerals and an explanation thereof will be omitted here. The contact test device $1_4$ includes a probe 2 and a socket 3. The probe 2 includes a plunger $6_4$ fixed integrally to one end of a tube 5, and an edge portion 19 of the plunger $6_4$ is formed at position (offset position) deviated from a center of a cylindrical portion 17. That is, while the edge portion 19 is formed by cutting or grinding both side surfaces in a manner of chamfering from a cylindrical member, a machining amount is different at right and left side surfaces. One side surface is formed into a plane $A_1$ machined by a large amount and the other surface is formed into a plane $A_2$ machined by a small amount. Front and rear surfaces of the edge portion 19 include arc surfaces B identical with the cylindrical portion 17, and the plate-like guide portion 19a disposed in offset is formed by these planes $A_1$, $A_2$ and the arc surfaces B.

An edge of the guide portion 19a is formed into an inclined surface C obliquely chamfered with a predetermined inclination angle. Right and left chamfered surfaces D are formed such that a center in a thickness direction of the inclined surfaces turns out to be an edge line, and an apex thereof is a peaked contact portion 19b.

An upper block 10 of the socket 3 is perforated by a drill from an under surface side joining with a lower block 11 to form the bottomed cylindrical first hole 12. A guide groove $13_4$ having a predetermined depth (a) is formed from the upper surface (s) of the upper block 10 by a dicing saw or the like such that the guide groove $13_4$ communicates on the bottomed parts of the first hole 12. The guide groove $13_4$ is arrayed such that it crosses the position offset by a predetermined distance from a center of the first hole 12.

The probe 2 is fitted into the socket 3 by fittingly inserting the probe 2 into the first hole 12 and the guide groove $13_4$ of the upper block 10 and the second hole 15 and the third hole 16 of the lower block 11 and joining these blocks 10 and 11 with each other. The guide portion 19a of the plunger $6_4$ disposed in offset with respect to the cylindrical portion 17 is inserted into the guide groove $13_4$ offset in the same amount with respect to the first hole 12 such that the plunger $6_4$ is guided movably in the vertical direction while being stopped from turning and from slipping out. At this time, even if the probe 2 is tried to be fitted into the retaining holes 12 and 15 by reversing by 180 degrees, it is not inserted because the guide portion 19a and the guide groove $13_4$ disposed in offset interfere with each other, so that it is possible to prevent erroneous insertion. The contact portion 19b of the plunger $6_4$ is disposed at one end portion on a width of the plate-like guide portion 19a which is shorter than a diameter (c) of the tube 5. This makes it possible to shorten a distance between the contact portions 19b of the neighboring probes and to narrow the pitch. It is noted that a direction of the offset is a direction orthogonal to the width direction of the plate-like guide portion 19a whose edge is the contact portion 19b.

Figure 14A:
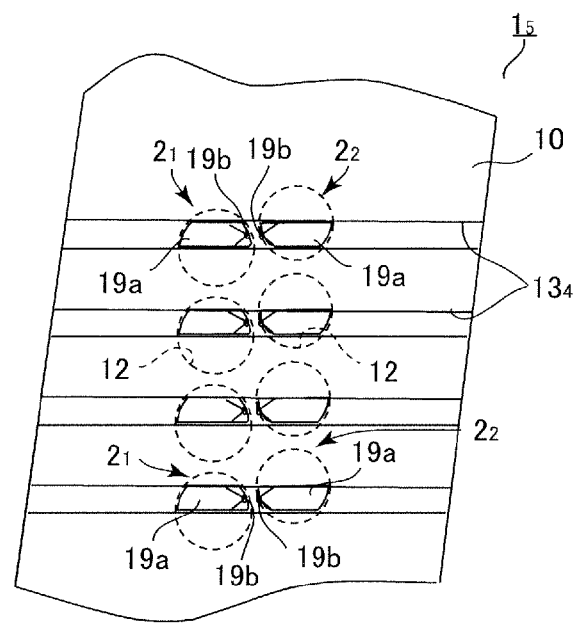
FIG. 14A is a plan view showing an embodiment in which contact test devices disposed in offset are used for a Kelvin test.
Figure 14B:
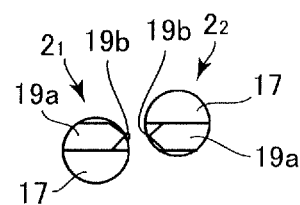
FIG. 14B is a plan view of a plunger edge portion.
Figure 14C:
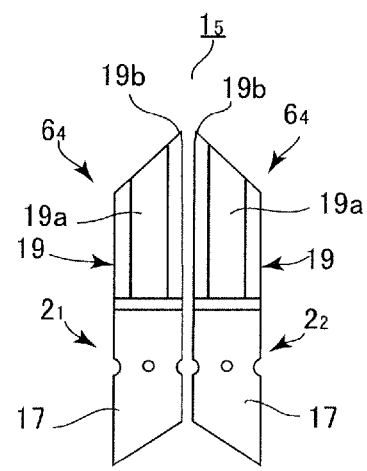
FIG. 14C is a front view thereof.

FIG. 14 illustrates an embodiment in which the contact test device is applied for Kelvin test. The contact test device (testing head) $1_5$ of the present embodiment is configured such that the edge portion 19 of the plunger $6_4$ disposed in offset with respect to the cylindrical portion (tube) is inserted into the guide groove $13_4$ crossing the position offset similarly with respect to the retaining hole 12. Accordingly, the probe retaining holes 12 of the upper block 10 are disposed alternately such that their center positions are located on opposite sides with respect to the guide groove $13_4$. Among a pair of probes $2_1$ and $2_2$ disposed adjacent along one guide groove $13_4$, one probe becomes a current supplying probe and the other probe becomes a voltage monitoring probe, to be used as a Kelvin test device. These pair of probes $2_1$ and $2_2$ is disposed alternately in the respective retaining holes 12 by reversing by 180 degrees.

The pair of Kelvin test probes $2_1$ and $2_2$ are disposed such that their contact portions 19b come close to each other and the respective retaining holes 12 face with each other at position shorter than a diameter of the retaining hole 12. Accordingly, the Kelvin test device $1_5$ makes it possible to narrow the pitch by shortening the between the contact portions 19b of the pair of probes $2_1$ and $2_2$ and to multi-polarize by arraying the probes 2 in zigzag obliquely with respect to the array direction of the terminals or electrodes of the test electronic parts.

FIG. 15A illustrates a semiconductor device 26 formed on a silicon wafer 25 to be tested based on a test pattern prepared in designing circuits of device under test (DUT). Electrodes having the same patters as shown in FIG. 15B are formed on the silicon wafer 25, and are cut into pieces by a dicing saw after testing (wafer test). The measurement of the electrical characteristics of the semiconductor device 26 is carried out by a probe card having a test head (contact test device) in the condition of the round silicon wafer. At this time, in order to increase an efficiency and speed of the measurement, the testing head is provided with a large number of probes 2 that allow a plurality of DUTs to be measured simultaneously. For instance, the testing head is provided with 18 probes to measure two semiconductor devices (2 DUT) 26, respectively having nine electrodes 21.

In order to carry out Kevin measurement shown in FIG. 7, 8 or 9 to each electrode 21 of the devices 26 of the two DUTs, it is necessary to make two probes $2_1$ and $2_2$ respectively come in contact with one electrode 21. In order to keep the distance of the respective probes, it is preferable to form the guide grooves 13 obliquely with 45 degrees with respect to the grid-like electrodes 21 as shown in FIG. 15C. This configuration makes it possible to obtain the Kelvin test device (testing head) $1_6$ in which the probes 2 are arrayed with the narrow pitch corresponding to the electrodes of DUT disposed in grid.

When the Kelvin measurement is to be carried out on a plurality of DUTs, there is a case when the oblique guide grooves 13 arrayed at equal intervals do not coincide between the electrodes 21 of the adjacent DUT. In such a case, it is necessary to array the guide grooves 13 in the vertical or horizontal direction in conformity with the array direction of the grid-like electrodes 21 in the contact test device. In this case, there is a possibility that it becomes difficult to manufacture a narrow-pitched testing head because a distance between the pair of Kelvin probes or a distance between the neighboring respective Kelvin probes is narrowed.

Figure 16:
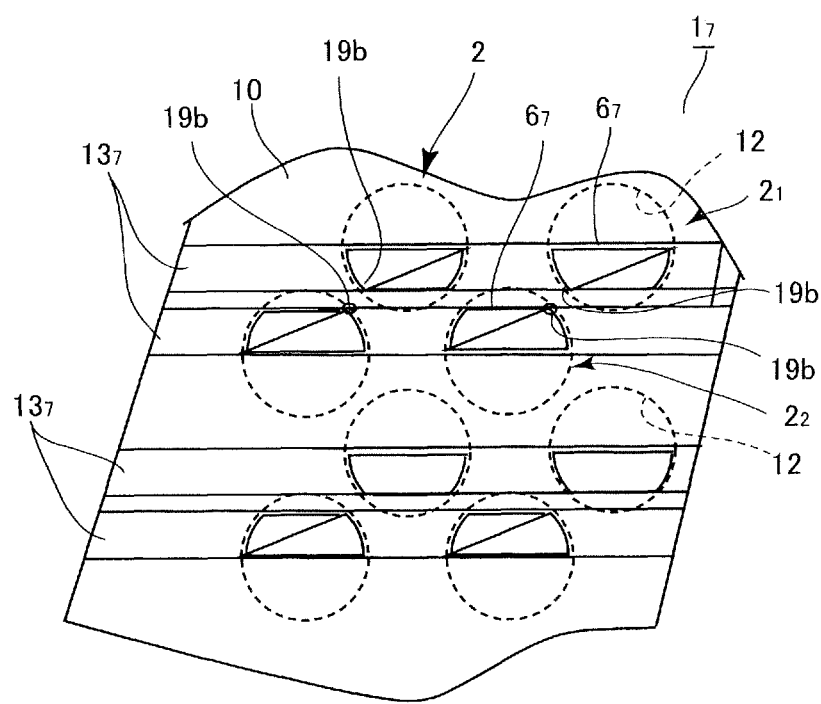
FIG. 16 is a plan view showing the contact test device arranged for Kelvin inspection applied to the device.
Figure 17A:
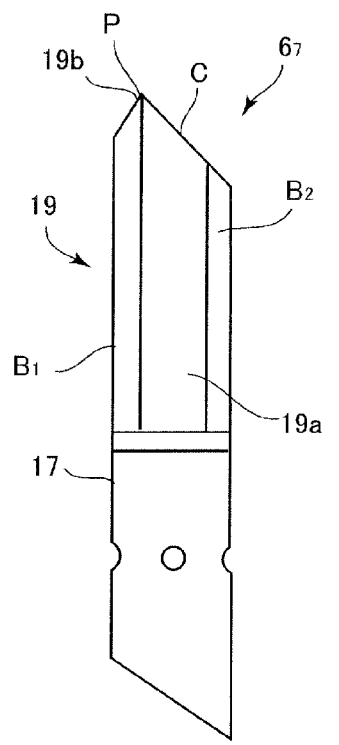
FIG. 17A is a front view showing the plunger edge portion.
Figure 17B:
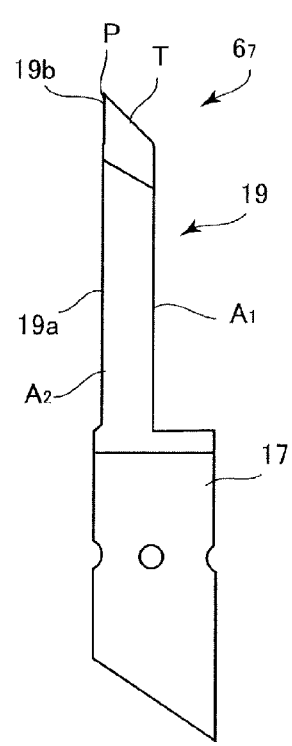
FIG. 17B is a side view thereof.
Figure 17C:
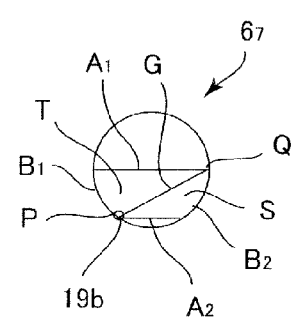
FIG. 17C is a front view thereof.

FIGS. 16 and 17 illustrate a shape of the plunger, an array of contact portions thereof, and a direction of the guide grooves solving the problem of the Kelvin measurement testing head of the two devices DUTs. A contact test device $1_7$ of the present embodiment is configured such that the guide grooves $13_7$ of the upper block are arrayed in the horizontal direction (or vertical direction) in parallel with the array direction of the grid-like electrodes in the same manner as shown in FIGS. 11 through 14. The edge portion 19 of the plunger $6_7$ is disposed in offset with respect to the cylindrical portion 17, and the guide grooves $13_7$ of the upper block are disposed in offset with respect to the first holes 12. While the guide grooves $13_7$ are arrayed horizontally in parallel in the same manner with the array of the electrodes, their distance is not equal because two guide grooves correspond to one row of array of electrodes.

The plunger edge portion 19 has a substantially rectangular plate-like guide portion 19a composed of an inner plane $A_1$ largely cut, an outer plane $A_2$ less cut, and front and rear arc surfaces $B_1$ and $B_2$, and a contact portion 19b having an edge line G connecting an apex P, i.e., a cross point, of one arc surface B1 and the outer plane $A_2$ and a cross point Q of the other arc surface $B_2$ and the inner plane $A_1$. That is, the plunger edge portion 19 is formed by a widthwise down-grade inclined surface C from one arc surface $B_1$ to the other arc surface $B_2$, an outer thickness direction inclined surface (s) obtained by chamfering the outer plane $A_2$ side toward the edge line G, and an inner thickness direction inclined surface T obtained by chamfering the inner plane $A_1$ side toward the edge line G, and the apex P of the edge line G becomes the contact portion 19b.

The pair of probes $2_1$ and $2_2$ guided by the adjacent guide grooves $13_7$ and adjacent in the guide groove direction become the Kelvin measuring probes, and are fitted into the respective retaining holes 12 in a condition reversed by 180 degrees. Accordingly, the pair of probes $2_1$ and $2_2$ are disposed at locations in which the contact portions 19b having the apex P are in close proximity with each other, and the Kelvin measurement in the case of 2 DUTs is carried out by coming in resiliently contact with one electrode, by assigning one probe as a current supplying probe and other probe as a voltage monitoring probe.

The contact test device (testing head) $1_7$ makes it possible to carry out the Kelvin measurement to a grid array DUT in which pitches of the electrodes are narrowed because the contact portions 19b of the pair of probes $2_1$ and $2_2$ become corners of one arc surface $B_1$ of the outer plane $A_2$ side and are located in close proximity with each other. Still further, the respective probes 2 are disposed obliquely by 45 degrees with respect to the grid-like electrodes, so that the distance between the probes can be fully widened and the testing head $1_7$ can be manufactured in high precision. Still further, the guide grooves $13_7$ are arrayed in the horizontal or vertical directions in parallel with the array of the grid-like electrodes, so that it is possible to manufacture the testing head $1_7$ by matching the probe positions to the large number of DUTs.

Figure 19A:
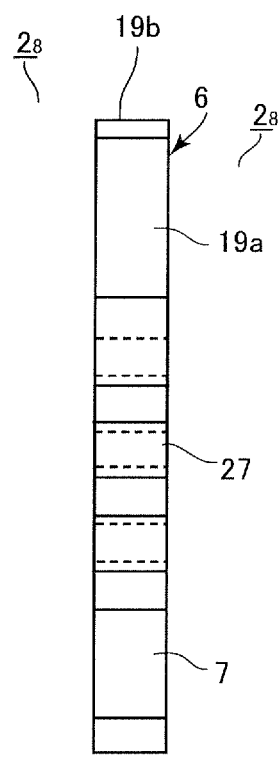
FIG. 19A is a front view showing the probe.
Figure 19B:
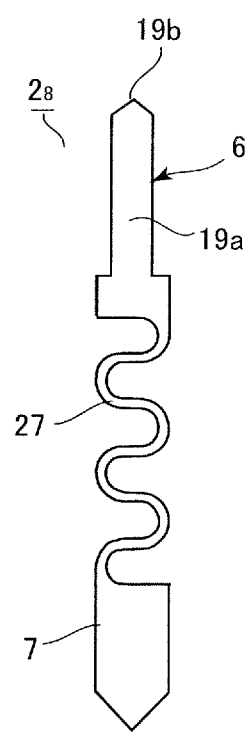
FIG. 19B is a side view thereof.
Figure 19C:
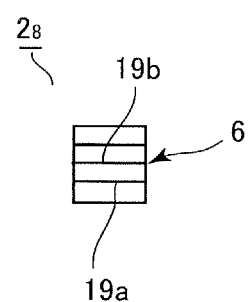
FIG. 19C is a plan view thereof.

FIGS. 18 and 19 illustrate a contact test device using a probe $2_8$ fabricated by electroforming. The contact test device (testing head) $1_8$ of the present embodiment has the sectionally rectangular probe $2_8$ integrally shaped by the electroforming, and a socket $3_8$ in which a plurality of blocks 10, $11_1$, and $11_2$ are laminated. The probe $2_8$ has the plunger 6 at one end, the abutting member 7 at another end, and a spring 27 between the plunger 6 and the abutting member 7. The plunger 6 is a plate-like, and has a guide portion 19a that engages with the guide groove 13 and a contact portion 19b whose edge is convexly chamfered.

The respective blocks 10, 11 and others composing the socket $3_8$ are formed into the same shape, except the uppermost one, i.e., the upper block 10. They have a cylindrical hole 30 formed respectively by drilling, and a groove 31 having a predetermined width of the cylindrical hole. The cylindrical hole 30 has a diameter in which the rectangular probe $2_8$ inscribes, and the groove 31 has a width in which the rectangular probe $2_8$ is inserted widthwise. The rectangular retaining hole is constructed by laminating the plurality of blocks $11_1$ and $11_2$.

The uppermost (first) block 10 is perforated by a predetermined depth from the lower surface to form the cylindrical holes 12 having the same diameter, and the guide groove 13 having a predetermined width is formed across the bottoms of the cylindrical holes. These blocks 10, $11_1$ and others are laminated such that the cylindrical holes 30 and 12 are aligned, and the respective probes $2_8$ are fitted into the cylindrical holes 30 and 12 and the grooves 31. The sectionally rectangular probe $2_8$ is retained while being stopped from turning by the cylindrical hole 30 and the groove 31 of the blocks $11_1$ and others. The plunger 6 of the probe $2_8$ is guided movably in the upward direction such that the plate-like guide portion 19a is stopped from being slipped out by the cylindrical hole 12 and the guide groove 13 of the uppermost block 10.

The present invention is applicable not only to the embodiments described above, but also to what the respective embodiments are combined, and is applicable also to a contact test device (testing head) using other different probes.

INDUSTRIAL APPLICABILITY

The present invention relates to the contact test device for use in functional tests of test electronic parts carried out in contact with each terminal or electrode of the test electronic parts. The invention is suitable for Kelvin testing and may be utilized for testing all kinds of electronic parts including QFP and silicon wafer.

REFERENCE SIGNS LIST

1 Contact test device (test head)
2 Probe
3 Socket
5 Tube
6 Plunger
7 Abutment member
10 (First) block
11 (Other) block
12,15 Retaining (cylindrical) hole
13,13a,13b Guide groove
17 Retaining (cylindrical) portion
19 Edge portion
19a Guide portion
19b Contact portion

The invention claimed is:

1. A contact test device configured to test electrical characteristics of a test electronic part, the contact test device comprising:
a probe configured to come into contact with a terminal or an electrode of the test electronic part and including a plunger biased such that the plunger is configured to come into resilient contact with the terminal or the electrode, the plunger including: a retaining portion;
a plate-like guide portion obtained by removing a side surface of the retaining portion of the plunger; and
a contact portion formed into a peak at an edge of the guide portion; and a socket configured to retain the probe and including at least a first block positioned on a side of the terminal or the electrode, the first block including:
a retaining hole which is a bottomed hole formed from a side opposite from a surface of the first block, on a terminal or electrode side, from which the contact portion protrudes out of the socket toward the terminal or the electrode; and
a guide groove defined by wall surfaces of the first block and formed to cross the bottomed hole on the surface of the first block on the terminal or electrode side, the guide groove having a width narrower than a width of the retaining hole;
wherein the guide portion includes flat planes facing each other and being configured to face the wall surfaces of the first block and to stop the plunger from turning by interfering with the wall surfaces of the first block; and
wherein the socket is configured to movably guide the plunger in an axial direction in the first block such that the retaining portion is retained and stopped from slipping out by the retaining hole of the first block and the guide portion is stopped from turning by the guide groove.

2. The contact test device according to claim 1, wherein the probe further includes:
a tube integrally secured with the retaining portion of the plunger;
an abutting member configured to be axially movably inserted into an end of the tube that is opposite to the probe; and
a spring stored in the tube contractively between the plunger and the abutting member;
wherein the socket is composed of a plurality of joined blocks including the first block; and
wherein each of the plurality of joined blocks other than the first block has a retaining hole corresponding to the retaining hole of the first block.

3. The contact test device according to claim 1, wherein the probe is a wire probe retained by the first block and a second block disposed apart from the first block by a space, and is configured to curve within the space such that resilience is applied in the axial direction;
wherein an end portion of the wire probe is formed into the plunger having the retaining portion, the guide portion and the contact portion.

4. A contact test device configured to test electrical characteristics of a test electronic part, the contact test device comprising:
a probe configured to come into contact with a terminal or an electrode of the test electronic part; and
a socket configured to retain the probe;
wherein the probe is shaped by electroforming into a rectangular shape in section;
wherein a plunger having a plate-like guide portion is formed by removing a side surface of the plunger and a contact portion at an edge of the guide portion is formed at an end of the probe;
wherein the socket is constructed by laminating a number of blocks in each of which a groove is formed on a first surface and a hole communicating with the groove is formed on a second surface;
wherein the groove and the hole are configured to retain the probe;
wherein the groove formed in a first one of the number of blocks located on a side of the terminal or the electrode among the number of blocks is a guide groove on the surface of the first block on a terminal or electrode side and having a narrow width and is configured to guide the guide portion of the plunger movably in an axial direction while stopping the plunger from slipping out; and
wherein the guide portion includes flat planes facing each other and being configured to face wall surfaces, defining the guide groove, of the first block and to stop the plunger from turning by interfering with the wall surfaces of the first block.

5. The contact test device according to claim 1, wherein the test electronic part is one of a plurality of test electronic parts and the guide groove is one of a plurality of guide grooves formed in a horizontal direction and a plurality of grooves formed in a vertical direction on a surface of the first block;
wherein the probe is one of a plurality of probes arrayed at both end parts at positions where the plurality of guide grooves formed in the horizontal direction and the plurality of grooves formed in the vertical direction do not cross; and
wherein the plurality of probes is disposed alternately in zigzag in a direction along each of the plurality of guide grooves formed in the horizontal direction and the plurality of grooves formed in the vertical direction corresponding to the terminals or the electrodes.

6. The contact test device according to claim 2, wherein the test electronic part is one of a plurality of test electronic parts and the guide groove is one of a plurality of guide grooves formed in a horizontal direction and a plurality of grooves formed in a vertical direction on a surface of the first block;
 wherein the probe is one of a plurality of probes arrayed at both end parts at positions where the plurality of guide grooves formed in the horizontal direction and the plurality of grooves formed in the vertical direction do not cross; and
 wherein the plurality of probes is disposed alternately in zigzag in a direction along each of the plurality of guide grooves formed in the horizontal direction and the plurality of grooves formed in the vertical direction corresponding to the terminals or the electrodes.

7. The contact test device according to claim 3, wherein the test electronic part is one of a plurality of test electronic parts and the guide groove is one of a plurality of guide grooves formed in a horizontal direction and a plurality of grooves formed in a vertical direction on a surface of the first block;
 wherein the probe is one of a plurality of probes arrayed at both end parts at positions where the plurality of guide grooves formed in the horizontal direction and the plurality of grooves formed in the vertical direction do not cross; and
 wherein the plurality of probes is disposed alternately in zigzag in a direction along each of the plurality of guide grooves formed in the horizontal direction and the plurality of grooves formed in the vertical direction corresponding to the terminals or the electrodes.

8. The contact test device according to claim 1, wherein the test electronic part is one of a plurality of test electronic parts, and the probe is one of a plurality of probes;
 wherein a pair of the plurality of probes is configured to come into contact with a same one of the terminals or the electrodes for a Kelvin test;
 wherein each of the contact portions of the plungers of the pair of the plurality of probes is formed by an end peak portion of the edge of a corresponding one of the plate-like guide portions inclining in a width direction; and
 wherein the pair of the plurality of probes for the Kelvin test is disposed such that the contact portions come into close proximity with each other.

9. The contact test device according to claim 2, wherein the test electronic part is one of a plurality of test electronic parts, and the probe is one of a plurality of probes;
 wherein a pair of the plurality of probes is configured to come into contact with a same one of the terminals or the electrodes for a Kelvin test;
 wherein each of the contact portions of the plungers of the pair of the plurality of probes is formed by an end peak portion of the edge of a corresponding one of the plate-like guide portions inclining in a width direction; and
 wherein the pair of the plurality of probes for the Kelvin test is disposed such that the contact portions come into close proximity with each other.

10. The contact test device according to claim 3, wherein the test electronic part is one of a plurality of test electronic parts, and the probe is one of a plurality of probes;
 wherein a pair of the plurality of probes is configured to come into contact with a same one of the terminals or the electrodes for a Kelvin test;
 wherein each of the contact portions of the plungers of the pair of the plurality of probes is formed by an end peak portion of the edge of a corresponding one of the plate-like guide portions inclining in a width direction; and
 wherein the pair of the plurality of probes for the Kelvin test is disposed such that the contact portions come into close proximity with each other.

11. The contact test device according to claim 8, wherein the pair of the plurality of probes for the Kevin test is disposed such that the guide portions of the plungers thereof are guided by the same guide groove.

12. The contact test device according to claim 1, wherein the retaining portion of the plunger is cylindrical, and the planes of the guide portion are a right plane and a left plane obtained by removing both sides of the cylindrical retaining portion by equal amounts; and
 wherein the guide portion includes a front arc surface and a rear arc surface extending from the retaining portion, and is disposed at a center part of the retaining portion.

13. The contact test device according to claim 8, wherein the retaining portion of the plunger is cylindrical, and the planes of the guide portion are a right plane and a left plane obtained by removing both sides of the cylindrical retaining portion by equal amounts; and
 wherein the guide portion includes a front arc surface and a rear arc surface extending from the retaining portion, and is disposed at a center part of the retaining portion.

14. The contact test device according to claim 11, wherein the retaining portion of the plunger is cylindrical, and the planes of the guide portion are a right plane and a left plane obtained by removing both sides of the cylindrical retaining portion by equal amounts; and
 wherein the guide portion includes a front arc surface and a rear arc surface extending from the retaining portion, and is disposed at a center part of the retaining portion.

15. The contact test device according to claim 1, wherein the retaining portion of the plunger is cylindrical, and the planes of the guide portion are a right plane and a left plane obtained by removing both sides of the cylindrical retaining portion by different amounts; and
 wherein the guide portion includes a front arc surface and a rear arc surface extending from the retaining portion, and is disposed in offset from a center part of the retaining portion.

16. The contact test device according to claim 8, wherein the retaining portion of the plunger is cylindrical, and the planes of the guide portion are a right plane and a left plane obtained by removing both sides of the cylindrical retaining portion by different amounts; and
 wherein the guide portion includes a front arc surface and a rear arc surface extending from the retaining portion, and is disposed in offset from a center part of the retaining portion.

17. The contact test device according to claim 8, wherein the retaining portion of each of the plungers is cylindrical and the planes of each of the guide portions are an inner plane and an outer plane obtained by removing both sides of the cylindrical retaining portion of each of the plungers by different amounts;
 wherein each of the guide portions includes a front arc surface and a rear arc surface extending from the retaining portion, and is disposed in offset from a center of the retaining portion;
 wherein each of the contact portions is composed of an apex which is a cross point of the outer plane and one of the front arc surface and the rear arc surface, the apex being formed by inclined surfaces inclined in a width direction and a thickness direction with an edge line connecting the apex and a cross point of the inner plane and another one of the front arc surface and the rear arc surface; and wherein the pair of the plurality of probes for the Kelvin test is disposed such that adjacent ones of the guide grooves are configured to guide the corresponding guide portions.

18. The contact test device according claim 1, wherein the guide groove is configured to extend longer than a diameter of the retaining hole and the width of the guide groove is substantially constant through a whole length of the guide groove.

19. A contact test device configured to test electrical characteristics of a test electronic part, the contact test device comprising:
  a first probe configured to come into contact with a terminal or an electrode of the test electronic part and including a first plunger biased such that the first plunger is configured to come into resilient contact with the terminal or the electrode, the first plunger including:
    a first retaining portion;
    a first plate-like guide portion obtained by removing a side surface of the first retaining portion of the first plunger; and
    a first contact portion formed into a peak at an edge of the first guide portion;
  a second probe including a second plunger disposed in parallel with the first plunger, the second plunger including:
    a second retaining portion;
    a second plate-like guide portion obtained by removing a side surface of the second retaining portion of the second plunger; and
    a second contact portion formed into a peak at an edge of the second guide portion; and
  a socket configured to retain the first probe and the second probe and including at least a first block positioned on a side of the terminal or the electrode, the first block including:
    a first retaining hole and a second retaining hole, each of which is a bottomed hole formed from a side opposite from a surface of the first block, on a terminal or electrode side, from which the first contact portion and the second contact portion protrude out of the socket toward the terminal or the electrode; and
    a guide groove defined by wall surfaces of the first block and formed to cross the first retaining hole and the second retaining hole on the surface of the first block on the terminal or electrode side, the guide groove having a width narrower than a width of the first retaining hole and a width of the second retaining hole;
  wherein the first guide portion includes flat planes facing each other and being configured to face the wall surfaces of the first block and to stop the first plunger from turning by interfering with the wall surfaces of the first block;
  wherein the second guide portion includes flat planes facing each other and being configured to face the wall surfaces of the first block and to stop the second plunger from turning by interfering with the wall surfaces of the first block;
  wherein the socket is configured to movably guide the first plunger in an axial direction in the first block such that the first retaining portion is retained and stopped from slipping out by the first retaining hole of the first block and the first guide portion is stopped from turning by the guide groove; and
  wherein the socket is configured to movably guide the second plunger in the axial direction in the first block such that the second retaining portion is retained and stopped from slipping out by the second retaining hole of the first block and the second guide portion is stopped from turning by the guide groove.

20. The contact test device according claim 19, wherein the first probe and the second probe form a pair of Kelvin test probes and are configured to come into contact with a same electrode or terminal.

* * * * *